US012686946B2

(12) United States Patent
Miyazaki et al.

(10) Patent No.:  US 12,686,946 B2
(45) Date of Patent:         Jul. 21, 2026

(54) GALLIUM ARSENIDE SINGLE CRYSTAL SUBSTRATE AND METHOD OF PRODUCING SAME

(71) Applicant: SUMITOMO ELECTRIC INDUSTRIES, LTD., Osaka (JP)

(72) Inventors: Yuichiro Miyazaki, Hyogo (JP);
Koichiro Aoyama, Hyogo (JP);
Tatsuya Moriwake, Hyogo (JP);
Katsushi Hashio, Hyogo (JP)

(73) Assignee: Sumitomo Electric Industries, Ltd.,
Osaka (JP)

( * ) Notice: Subject to any disclaimer, the term of this patent is extended or adjusted under 35 U.S.C. 154(b) by 0 days.

(21) Appl. No.: 19/115,422

(22) PCT Filed: Dec. 27, 2022

(86) PCT No.: PCT/JP2022/048248
§ 371 (c)(1),
(2) Date: Mar. 26, 2025

(87) PCT Pub. No.: WO2024/142270
PCT Pub. Date: Jul. 4, 2024

(65) Prior Publication Data
US 2026/0132546 A1       May 14, 2026

(51) Int. Cl.
*B32B 3/02*          (2006.01)
*C30B 11/00*        (2006.01)
*C30B 29/40*        (2006.01)

(52) U.S. Cl.
CPC .............. *C30B 29/403* (2013.01); *B32B 3/02* (2013.01); *C30B 11/002* (2013.01)

(58) Field of Classification Search
CPC ............................ C30B 11/002; C30B 29/403
See application file for complete search history.

(56) References Cited

U.S. PATENT DOCUMENTS

| | | | |
|---|---|---|---|
| 2009/0098377 A1 | 4/2009 | Oshika | |
| 2021/0310155 A1* | 10/2021 | Fukunaga | ............. C30B 11/003 |
| 2023/0243067 A1* | 8/2023 | Sunachi | .................. C30B 27/00 |
| | | | 117/83 |

FOREIGN PATENT DOCUMENTS

| | | |
|---|---|---|
| JP | 8-162378 A | 6/1996 |
| JP | 9-59083 A | 3/1997 |

(Continued)

OTHER PUBLICATIONS

Itani et al., "Low-dislocation-density GaAs Wafers Grown by Vertical Gradient Freeze Process, Suitable for Mass Production of Semiconductor Lasers", Hitachi Cable Review, vol. 20, Aug. 2001, pp. 35-38 (English version of Sasabe et. al., "VGF Method Suitable for Mass Production of Semiconductor Lasers, Low Dislocation Density GaAs Wafer", Hitachi Cable, vol. 20, Aug. 2001, pp. 33-36).

*Primary Examiner* — Elizabeth E Mulvaney

(74) *Attorney, Agent, or Firm* — Renner, Otto, Boisselle & Sklar, LLP

(57) ABSTRACT

A gallium arsenide single crystal substrate is a gallium arsenide single crystal substrate having a main surface having a circular shape, wherein an average value of a dislocation density of the main surface is 5 cm$^{-2}$ or more and 100 cm$^{-2}$ or less, and in an imaginary grid formed by laying out squares each having each side of 2 mm on the main surface such that a largest number of the squares are arranged side by side without overlapping with each other, a ratio of the number of squares in which no dislocation is present to a total number of the squares constituting the grid is 97.0% or more and 99.5% or less, the gallium arsenide single crystal substrate including silicon, wherein a concentration of the silicon is $1.0 \times 10^{18}$ cm$^{-3}$ or more and $5.0 \times 10^{19}$ cm$^{-3}$ or less.

7 Claims, 3 Drawing Sheets

(56) References Cited

FOREIGN PATENT DOCUMENTS

| | | | |
|----|----|----|----|
| JP | 2004115339 | A * | 4/2004 |
| JP | 2011-527280 | A | 1/2010 |
| JP | 2010-059052 | A | 3/2010 |
| JP | 2011-148693 | A | 8/2011 |
| JP | 2011-148694 | A | 8/2011 |
| JP | 2012-246156 | A | 12/2012 |
| JP | 2021-533057 | A | 12/2021 |
| WO | 2006/106644 | A1 | 10/2006 |
| WO | 2020/245215 | A1 | 12/2020 |
| WO | 2021/005731 | A1 | 1/2021 |
| WO | 2021/251349 | A1 | 12/2021 |

* cited by examiner

GALLIUM ARSENIDE SINGLE CRYSTAL SUBSTRATE AND METHOD OF PRODUCING SAME

This application is a national phase of International Application No. PCT/JP2022/048248 filed Dec. 27, 2022, which is hereby incorporated herein by reference in its entirety.

TECHNICAL FIELD

The present disclosure relates to a gallium arsenide single crystal substrate and a method of producing the same.

BACKGROUND ART

WO 2006/106644 (PTL 1) discloses a gallium arsenide single crystal ingot (hereinafter, also referred to as "GaAs single crystal ingot") doped with silicon (Si) and to be applied to a gallium arsenide single crystal substrate (hereinafter, also referred to as "GaAs single crystal substrate"). An average value of a dislocation density of the GaAs single crystal ingot is 50 cm$^{-2}$ or less, and a relation of C0.8/C0.1<2.0 is satisfied when C0.1 is defined as a carrier concentration at a portion having a solidification ratio of 0.1 and C0.8 is defined as a carrier concentration at a portion having a solidification ratio of 0.8. Further, PTL 1 discloses that the carrier concentration of the GaAs single crystal ingot is 1.0×10$^{17}$ cm$^{-3}$ or more and 1.0×10$^{19}$ cm$^{-3}$ or less. WO 2021/251349 (PTL 2) discloses a GaAs single crystal ingot in which an average value of a dislocation density is 500 cm$^{-2}$ or less, an atomic concentration of Si is 2.0×10$^{17}$ cm$^{-3}$ or more and 1.5×10$^{19}$ cm$^{-3}$ or less, and a carrier concentration is 5.5×10$^{17}$ cm$^{-3}$ or less. Each of Japanese Patent Laying-Open No. 2011-148693 (PTL 3) and Japanese Patent Laying-Open No. 2011-148694 (PTL 4) discloses an n type GaAs single crystal substrate doped with Si. In the GaAs single crystal substrate, the average value of the dislocation density in each of PTL 3 and PTL 4 is 40 to 100 cm$^{-2}$ and 15 to 30 cm$^{-2}$, and the Si atomic concentrations in PTL 3 and PTL 4 are respectively 5.0×10$^{16}$ cm$^{-3}$ or more and 5.0×10$^{17}$ cm$^{-3}$ or less and 5.0×10$^{16}$ cm$^{-3}$ or more and 5.0×10$^{17}$ cm$^{-3}$ or less. Each of Japanese National Patent Publication No. 2011-527280 (PTL 5) and NPL 1 described below discloses a measurement method in which squares each having a predetermined size are formed on a main surface and a dislocation density is determined by counting dislocations present in each of the squares.

CITATION LIST

Patent Literature

PTL 1: WO 2006/106644
PTL 2: WO 2021/251349
PTL 3: Japanese Patent Laying-Open No. 2011-148693
PTL 4: Japanese Patent Laying-Open No. 2011-148694
PTL 5: Japanese National Patent Publication No. 2011-527280

Non Patent Literature

NPL 1: Sasabe, et. al., "VGF Method Suitable for Mass Production of Semiconductor Lasers, Low Dislocation Density GaAs Wafer", Hitachi Cable, Vol. 20, August, 2001, pp. 33 to 36

SUMMARY OF INVENTION

A gallium arsenide single crystal substrate according to the present disclosure is a gallium arsenide single crystal substrate having a main surface having a circular shape. An average value of a dislocation density of the main surface is 5 cm$^{-2}$ or more and 100 cm$^{-2}$ or less. In an imaginary grid formed by laying out squares each having each side of 2 mm on the main surface such that a largest number of the squares are arranged side by side without overlapping with each other, a ratio of the number of squares in each of which no dislocation is present to a total number of the squares constituting the grid is 97.0% or more and 99.5% or less. A diameter of the gallium arsenide single crystal substrate is 70 mm or more. The gallium arsenide single crystal substrate includes silicon. An atomic concentration of the silicon is 1.0×10$^{18}$ cm$^{-3}$ or more and 5.0×10$^{19}$ cm$^{-3}$ or less. A carrier concentration of the gallium arsenide single crystal substrate is 1.0×10$^{18}$ cm$^{-3}$ or more and 4.0×10$^{18}$ cm$^{-3}$ or less.

A method of producing a gallium arsenide single crystal substrate according to the present disclosure is a method of producing a gallium arsenide single crystal substrate having a main surface having a circular shape. The method includes: obtaining a gallium arsenide single crystal by performing crystal growth using a gallium arsenide single crystal growth apparatus; and obtaining the gallium arsenide single crystal substrate by processing the gallium arsenide single crystal. The gallium arsenide single crystal growth apparatus includes a crucible, a crucible holding base that holds the crucible, and a heating element that heats the crucible. The crucible includes a seed crystal accommodation portion having a cylindrical shape, an increased-diameter portion connected to the seed crystal accommodation portion, and a straight barrel portion connected to the increased-diameter portion. The seed crystal accommodation portion has a hollow portion, the hollow portion being opened on a side on which the seed crystal accommodation portion is connected to the increased-diameter portion, the hollow portion being provided with a bottom wall formed on a side opposite to the increased-diameter portion. The increased-diameter portion has a truncated conical shape having a diameter that is increased upward in an axial direction of the crucible, and is connected to the seed crystal accommodation portion on a small diameter side of the increased-diameter portion. The straight barrel portion has a hollow cylindrical shape and is connected to a large diameter side of the increased-diameter portion. The crucible holding base holds the increased-diameter portion without contact with the straight barrel portion. When an inner diameter of the straight barrel portion is represented by D1 and an outer diameter of the crucible holding base is represented by D2, the D1 and the D2 satisfy a relation of 1.0<D2/D1<1.5, and a unit of each of the D1 and the D2 is mm.

DETAILED DESCRIPTION

Figure 1:
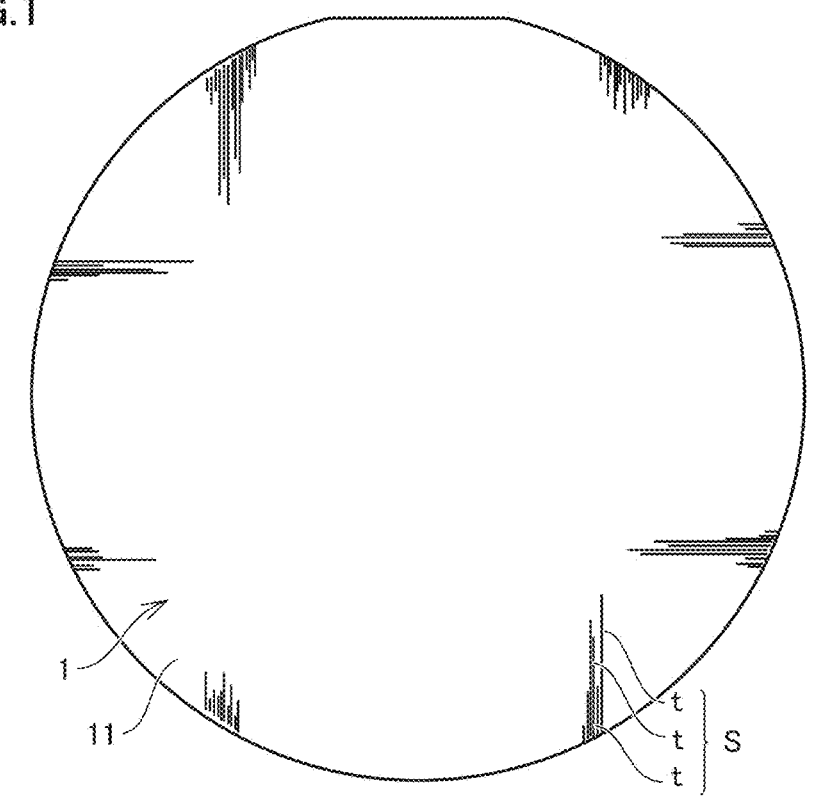
FIG. 1 is an explanatory view illustrating etch pits exhibited in a main surface of a gallium arsenide single crystal substrate according to the present embodiment by etching using molten potassium hydroxide.

Problem to be Solved by the Present Disclosure

Generally, it is considered that as the average value of the dislocation density in the main surface of the GaAs single crystal substrate is smaller, a yield (hereinafter, also referred to as "element yield") of producing semiconductor devices from the substrate is more improved. However, according to the research by the present inventors, it has been found that there is a difference in the element yield even when comparing GaAs single crystal substrates in which respective average values of dislocation densities in main surfaces thereof are equivalently small. Further, it has also been found that when the dislocation density of a main surface is zero or very small, cracking is likely to occur at the time of processing each of a GaAs single crystal ingot and a GaAs single crystal substrate, with the result that the element yield is not necessarily improved. That is, even when development is progressed to attain a GaAs single crystal substrate having a main surface having a smaller average value of dislocation density, it cannot be said that the element yield is necessarily improved, and therefore each of the above-described GaAs single crystal substrates of PTL 1 to PTL 4 has room for improvement from the viewpoint of improving the element yield. It should be noted that in the GaAs single crystal substrate of NPL 1, the average value of the dislocation density was not calculated in the entire main surface, and therefore it cannot be said that the element yield is necessarily improved. Further, in the GaAs single crystal substrate of PTL 5, the average value of the dislocation density of the main surface is large in the first place.

In view of the above circumstance, an object of the present disclosure is to provide: a gallium arsenide single crystal substrate allowing for improved element yield; and a method of producing the gallium arsenide single crystal substrate.

Advantageous Effect of the Present Disclosure

According to the present disclosure, it is possible to provide: a gallium arsenide single crystal substrate allowing for improved element yield; and a method of producing the gallium arsenide single crystal substrate.

DESCRIPTION OF EMBODIMENTS

First, an overview of an embodiment of the present disclosure will be described. The present inventors have conducted diligent study in order to solve the above problem. The present inventors have found that when a GaAs single crystal substrate is first divided into sections each having a size corresponding to an element for forming a semiconductor device and a dislocation density is evaluated in each of the sections, the element yield is more improved as the number of sections in which the dislocation density is zero is larger. Furthermore, the present inventors have also found that a GaAs single crystal substrate in which a dislocation density in the entire main surface is small but not zero is less likely to be cracked at the time of processing than a GaAs single crystal substrate in which a dislocation density in the entire main surface is zero as described above, thus resulting in improved element yield. Based on these findings, the present inventors have performed crystal growth of a GaAs single crystal having a small average value of dislocation density while controlling heat distribution in the crystal to be uniform. As a result, the present inventors have found that the above-described element yield can be significantly improved in a GaAs single crystal substrate obtained from the GaAs single crystal, thereby completing the present disclosure.

Next, embodiments of the present disclosure will be listed and described.

[1] A gallium arsenide single crystal substrate according to one embodiment of the present disclosure is a gallium arsenide single crystal substrate having a main surface having a circular shape. An average value of a dislocation density of the main surface is 5 cm$^{-2}$ or more and 100 cm$^{-2}$ or less. In an imaginary grid formed by laying out squares each having each side of 2 mm on the main surface such that a largest number of the squares are arranged side by side without overlapping with each other, a ratio of the number of squares in each of which no dislocation is present to a total number of the squares constituting the grid is 97.0% or more and 99.5% or less. A diameter of the gallium arsenide single crystal substrate is 70 mm or more. The gallium arsenide single crystal substrate includes silicon. An atomic concentration of the silicon is 1.0×10$^{18}$ cm$^{-3}$ or more and 5.0×10$^{19}$ cm$^{-3}$ or less. A carrier concentration of the gallium arsenide single crystal substrate is 1.0× 10$^{18}$ cm$^{-3}$ or more and 4.0×10$^{18}$ cm$^{-3}$ or less. With the gallium arsenide single crystal substrate having such a feature, the element yield can be improved.

[2] A crystal plane of the main surface is preferably a {100} plane of a gallium arsenide single crystal or a plane having an off angle of more than 0° and 3° or less with respect to the {100} plane of the gallium arsenide single crystal. Preferably, the dislocation is included in a slip line, and the slip line is present along at least one direction selected from a group consisting of four directions equivalent to a [01−1] direction of the gallium arsenide single crystal, so as to extend from an outer periphery of the main surface toward an inner side of the main surface. Thus, in the gallium arsenide single crystal substrate including the slip line, the element yield can be improved.

[3] and [4] The diameter of the gallium arsenide single crystal substrate is preferably 70 mm or more and 210 mm or less. Thus, the element yield can be improved in such a so-called large-diameter gallium arsenide single crystal substrate having a diameter of 70 mm or more and 210 mm or less.

[5] Preferably, the gallium arsenide single crystal substrate includes boron, and an atomic concentration of the boron is 1.0×10$^{18}$ cm$^{-3}$ or more and 1.0×10$^{19}$ cm$^{-3}$ or less. Thus, a gallium arsenide single crystal substrate having the small number of dislocations can be provided.

[6] A method of producing a gallium arsenide single crystal substrate according to one aspect of the present disclosure is a method of producing a gallium arsenide single crystal substrate having a main surface having a circular shape. The method includes: obtaining a gallium arsenide single crystal by performing crystal growth using a gallium arsenide single crystal growth apparatus; and obtaining the gallium arsenide single crystal substrate by processing the gallium arsenide single crystal. The gallium arsenide single crystal growth apparatus includes a crucible, a crucible holding base that holds the crucible, and a heating element that heats the crucible. The crucible includes a seed crystal accommodation portion having a cylindrical shape, an increased-diameter portion connected to the seed crystal accommodation portion, and a straight barrel portion connected to the increased-diameter portion. The seed crystal accommodation portion has a hollow portion, the hollow portion being opened on a side on which the seed crystal accommodation portion is connected to the increased-diameter portion, the hollow portion being provided with a bottom wall formed on a side opposite to the increased-diameter portion. The increased-diameter portion has a truncated conical shape having a diameter that is increased upward in an axial direction of the crucible, and is connected to the seed crystal accommodation portion on a small diameter side of the increased-diameter portion. The straight barrel portion has a hollow cylindrical shape and is connected to a large diameter side of the increased-diameter portion. The crucible holding base holds the increased-diameter portion without contact with the straight barrel portion. When an inner diameter of the straight barrel portion is represented by D1 and an outer diameter of the crucible holding base is represented by D2, the D1 and the D2 satisfy a relation of $1.0 < D2/D1 < 1.5$, and a unit of each of the D1 and the D2 is mm. According to the method of producing the gallium arsenide single crystal substrate with such a feature, a gallium arsenide single crystal substrate improved in element yield can be obtained.

[7] Preferably, the obtaining the gallium arsenide single crystal includes: accommodating the seed crystal into the seed crystal accommodation portion and accommodating gallium arsenide in a form of a lump together with silicon into each of the increased-diameter portion and the straight barrel portion; melting a part of the seed crystal and the gallium arsenide into a gallium arsenide melt by heating the crucible using the heating element and bringing the gallium arsenide melt into contact with a remainder of the seed crystal; and performing crystal growth of the gallium arsenide single crystal from the gallium arsenide melt on the remainder of the seed crystal. The performing the crystal growth is preferably performed while performing control such that a value obtained by performing second-order differentiation onto a temperature at an interface between the gallium arsenide single crystal and the gallium arsenide melt becomes $0.003°$ C./mm$^2$ or more and $0.012°$ C./mm$^2$ or less, the second-order differentiation being performed at a position of the interface in an axial direction of the crucible. A positive direction of the position is preferably a direction from a lower side of the crucible toward an upper side of the crucible along the axial direction. A concentration of the silicon in the gallium arsenide single crystal substrate is preferably $1.0 \times 10^{18}$ cm$^{-3}$ or more and $5.0 \times 10^{19}$ cm$^{-3}$ or less. Thus, a gallium arsenide single crystal substrate further improved in element yield can be obtained.

Details of Embodiments

Hereinafter, one embodiment (hereinafter, also referred to as "the present embodiment") according to the present disclosure will be described more in detail, but the present disclosure is not limited thereto. Although explanation will be made in the description below with reference to figures, the same or corresponding elements will be denoted by the same reference characters in the present specification and figures, and the same explanation therefor will not be described repeatedly. Moreover, in each of the figures, the scale of each component is appropriately adjusted in order to facilitate understanding, and the scale of each component shown in each of the figures does not necessarily coincide with the actual scale of the component.

In the present specification, the expression "A to B" represents a range of lower to upper limits (i.e., A or more and B or less), and when no unit is indicated for A and a unit is indicated only for B, the unit of A is the same as the unit of B. Moreover, when a compound or the like is expressed by a chemical formula in the present specification and an atomic ratio is not particularly limited, it is assumed that all the conventionally known atomic ratios are included, and the atomic ratio should not be necessarily limited only to one in the stoichiometric range.

In the present specification, a "main surface" of a gallium arsenide single crystal substrate means each of two circular surfaces of the substrate. When at least one of the two surfaces of the gallium arsenide single crystal substrate satisfies the scope of claims with regard to the present disclosure, the gallium arsenide single crystal substrate falls within the scope of the present invention. An epitaxial film may be disposed on the "main surface" of the gallium arsenide single crystal substrate. Moreover, in the present specification, the term "plane" used in the expression "in-plane" or "in the plane" means the "main surface". Further, when it is described that the diameter of the gallium arsenide single crystal substrate is "70 mm", it means that the diameter is about 70 mm (about 70 to 76.5 mm) or 3 inches. When it is described that the diameter is "100 mm", it means that the diameter is about 100 mm (about 95 to 105 mm) or 4 inches. When it is described that the diameter is "150 mm", it means that the diameter is about 150 mm (about 145 to 155 mm) or 6 inches. When it is described that the diameter is "210 mm", it means that the diameter is about 210 mm (about 195 to 210 mm) or 8 inches. The diameter can be measured by using a conventionally known outer diameter measurement device such as a caliper.

In the present specification, the term "element yield" means a yield obtained by multiplying a processing yield and a performance yield, the processing yield indicating a ratio at which a VCSEL (vertical cavity surface emitting laser)-formed wafer can be obtained from the gallium arsenide single crystal substrate without occurrence of cracking, chipping, or the like during processing, the performance yield indicating a ratio at which VCSELs obtained from the wafers can each satisfy a required predetermined performance. The "element yield" can be expressed by a percentage. The "processing yield" can be expressed by a ratio at which cracking, chipping, or the like does not occur in the substrate in a series of steps from a step of performing epitaxial growth to form a light emitting layer or the like on a gallium arsenide single crystal substrate to a step of forming the VCSEL-formed wafer. The "performance yield" can be expressed by a ratio of non-defective products as obtained by performing an accelerated deterioration test through burn-in onto the VCSELs obtained from the wafer and determining whether each of the VCSELs is non-defective or defective in accordance with a degree of deterioration after the test.

Regarding crystallographic indications in the present specification, an individual orientation is represented by [ ], a group orientation is represented by < >, and an individual plane is represented by ( ), and a group plane is represented by { }. Moreover, a negative crystallographic index is normally expressed by putting "-" (bar) above a numeral, but is expressed by putting the negative sign before the numeral when stated in the present specification.

[Gallium Arsenide Single Crystal Substrate]

A gallium arsenide single crystal substrate (GaAs single crystal substrate) according to the present embodiment is a GaAs single crystal substrate having a main surface having a circular shape. An average value of a dislocation density of the main surface is 5 cm$^{-2}$ or more and 100 cm$^{-2}$ or less. In an imaginary grid formed by laying out squares each having each side of 2 mm on the main surface such that a largest number of the squares are arranged side by side without overlapping with each other, a ratio of the number of squares in each of which no dislocation is present to a total number of the squares constituting the grid is 97.0% or more and 99.5% or less. A diameter of the GaAs single crystal substrate is 70 mm or more. The GaAs single crystal substrate includes silicon. A concentration of the silicon is $1.0 \times 10^{18}$ cm$^{-3}$ or more and $5.0 \times 10^{19}$ cm$^{-3}$ or less. A carrier concentration of the GaAs single crystal substrate is $1.0 \times 10^{18}$ cm$^{-3}$ or more and $4.0 \times 10^{18}$ cm$^{-3}$ or less. With the GaAs single crystal substrate having such a feature, the element yield can be improved.

The element yield can be improved by the GaAs single crystal substrate presumably due to the following reason. That is, the GaAs single crystal substrate is composed of a gallium arsenide single crystal (hereinafter, also referred to as "GaAs single crystal"). The gallium arsenide single crystal is produced using a gallium arsenide single crystal growth apparatus (hereinafter, also referred to as "GaAs single crystal growth apparatus") having a predetermined crucible holding base based on a method described in the below-described section [Method of Producing Gallium Arsenide Single Crystal Substrate]. That is, the gallium arsenide single crystal is produced by using the single crystal growth apparatus to strictly control a temperature at an interface position between the GaAs single crystal and a gallium arsenide melt (hereinafter, also referred to as "GaAs melt"). Thus, the crystal growth of the GaAs single crystal can be attained while maintaining an interface shape formed by uniform heat distribution in the crystal, with the result that dislocations based on thermal strains can be suppressed from being generated in the ingot of the GaAs single crystal. The ingot of the GaAs single crystal can also obtain an effect of reducing the dislocation density due to doping with silicon. Moreover, since a special production method for attaining no dislocation in the entire main surface is not employed, occurrence of cracking, chipping, and the like can be avoided in the GaAs single crystal substrate when obtaining the GaAs single crystal substrate by processing the GaAs single crystal. In view of the above, it is considered that with the GaAs single crystal substrate according to the present embodiment, the element yield can be improved based on the below-described production method.

<Main Surface>

The GaAs single crystal substrate according to the present embodiment has the main surface having the circular shape as described above. In the present specification, the "circular shape" representing the shape of the main surface includes not only a geometric circular shape but also a shape when the main surface does not form the geometric circular shape due to formation of at least one of a notch, an orientation flat (hereinafter, also referred to as "OF"), and an index flat (hereinafter, also referred to as "IF") in an outer periphery of the main surface. Here, the "shape when the main surface does not form a geometric circular shape" means a shape when the length of a line segment extending from any point on the notch, OF, and IF to the center of the main surface is short among line segments each extending from any point on the outer periphery of the main surface to the center of the main surface. Further, the "shape when the main surface does not form a geometric circular shape" also includes a shape when the lengths of all the line segments each extending from any point on the outer periphery of the main surface to the center of the main surface are not necessarily the same due to the shape of a GaAs single crystal serving as a source material for the GaAs single crystal substrate. In this case, the center of the main surface refers to the position of the center of gravity. The diameter of the GaAs single crystal substrate refers to the length of the longest line segment among the line segments each extending from any point on the outer periphery of the GaAs single crystal substrate to another point on the outer periphery via the center of the main surface.

The surface roughness of the main surface is preferably 0.3 nm or less in terms of surface roughness Sa defined in JIS B 0681-2:2018. Thus, the main surface becomes a mirror surface, thereby contributing to improved device property. Surface roughness Sa of the main surface is more preferably 0.2 nm or less, and is still more preferably 0.1 nm or less. Surface roughness Sa of the main surface is measured by using an intermittent contact mode of a conventionally known atomic force microscope (for example, trade name: "Dimension 3000" provided by Bruker). More specifically, the measurement is performed in such a manner that a size of 512×512 pixels for calculating surface roughness Sa using the atomic force microscope is caused to correspond to any square region having a length of 0.2 μm×a width of 0.2 μm on the main surface. Thus, surface roughness Sa in the region is determined.

Here, surface roughness Sa does not need to be 0.3 nm or less in each of all the regions having been subjected to the measurement on the main surface, and surface roughness Sa measured in at least one region of the plurality of regions set on the main surface of the GaAs single crystal substrate may be 0.3 nm or less. As the region on the main surface for measuring surface roughness Sa, for example, each of the following five regions in total can be selected as the center of a measurement range: the center of the GaAs single crystal substrate; and any four points each located on a circumference located inward by 5 mm from the outer edge of the GaAs single crystal substrate.

(Dislocation Density)

The average value of the dislocation density of the main surface is 5 cm$^{-2}$ or more and 100 cm$^{-2}$ or less. Further, in the imaginary grid formed by laying out the squares each having each side of 2 mm on the main surface such that the largest number of the squares are arranged side by side without overlapping with each other, the ratio (hereinafter, also referred to as "dislocation-free ratio") of the number of the squares in which no dislocation is present to the total number of the squares constituting the grid is 97.0% or more and 99.5% or less. From another viewpoint, it can be said that a probability that dislocations are not present in the squares constituting the grid is 97.0% or more and 99.5% or less. Specifically, each of the average value of the dislocation density and the dislocation-free ratio of the main surface is determined by counting corroded pits (hereinafter, also referred to as "etch pits") exhibited in the main surface after etching the main surface using molten potassium hydroxide. That is, in the GaAs single crystal substrate according to the present embodiment, the average value of the number of the etch pits is 5 cm$^{-2}$ or more and 100 cm$^{-2}$ or less, and the ratio of the number of the squares in each of which no etch pit is present to the total number of the squares constituting the grid is 97.0% or more and 99.5% or less. The definition of the "etch pit" is not academically the same as the definition of the dislocation, but the etch pit can be regarded as being equivalent to the dislocation in the present technical field. (Method of Calculating the Number of Etch Pits)

Figure 2:
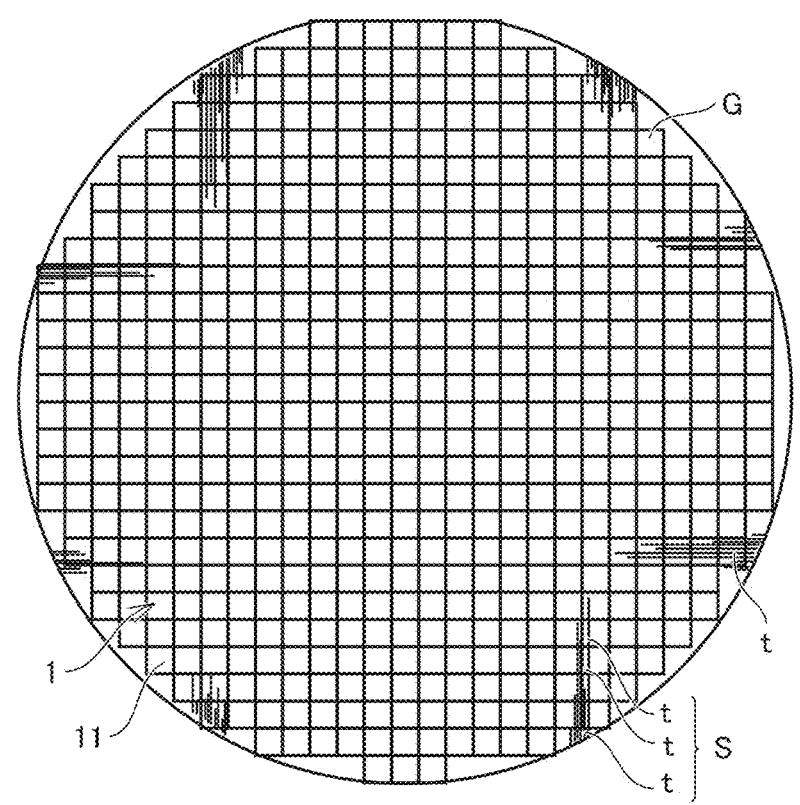
FIG. 2 is an explanatory view illustrating a state in which an imaginary grid in which squares each having each side of 2 mm are laid out on the main surface of the gallium arsenide single crystal substrate shown in FIG. 1 such that the largest number of the squares are arranged side by side without overlapping with each other is set in order to determine a dislocation density in the main surface.

FIG. 1 is an explanatory view illustrating the etch pits exhibited in the main surface of the gallium arsenide single crystal substrate according to the present embodiment by etching using molten potassium hydroxide. FIG. 2 is an explanatory view illustrating a state in which the imaginary grid in which the squares each having each side of 2 mm are laid out on the main surface of the gallium arsenide single crystal substrate shown in FIG. 1 such that the largest number of the squares are arranged side by side without overlapping with each other is set in order to determine the dislocation density in the main surface. Hereinafter, a specific method of calculating the number of the etch pits will be described with reference to FIGS. 1 and 2.

First, the main surface of the GaAs single crystal substrate is immersed in the molten potassium hydroxide at 500° C. for 10 minutes. Then, the GaAs single crystal substrate is taken out from the molten potassium hydroxide. As a method of immersing the GaAs single crystal substrate, a conventionally known method can be used. Thus, the GaAs single crystal substrate in which the dislocations present in the main surface are exhibited as the etch pits is obtained. For example, as shown in FIG. 1, a GaAs single crystal substrate 1 in which a plurality of dislocations t are present in series as etch pits from an outer periphery to an inner side of a main surface 11 is obtained. A bundle of dislocations t constituted of the plurality of dislocations t exhibited in GaAs single crystal substrate 1 is referred to as a slip line S as described later. It should be noted that the crystal plane of main surface 11 of GaAs single crystal substrate 1 shown in FIG. 1 is a {100} plane.

Next, as shown in FIG. 2, an imaginary grid G formed by laying out squares each having each side of 2 mm on main surface 11 of GaAs single crystal substrate 1 such that the largest number of the squares are arranged side by side without overlapping with each other is set. Further, the number of etch pits exhibited in one visual field of a known optical microscope (for example, trade name: "ECLIPSE (registered trademark) LV150N" provided by Nikon) is counted by observing each of the squares constituting imaginary grid G using the optical microscope. In this case, the observation by the optical microscope is performed at a magnification of 50 times. Thus, the one visual field of the optical microscope has a size of 2 mm×2 mm and corresponds to the size of the square. Therefore, the number of the etch pits in each visual field is determined as the number of dislocations in each of the squares constituting imaginary grid G. It should be noted that regarding the number of the etch pits, only an etch pit confirmed to have an area of 100 μm$^2$ or more is counted.

Finally, the number of the etch pits counted in each of the squares constituting imaginary grid G is converted into the number thereof per cm$^2$. Thus, respective dislocation densities in the squares are calculated. Then, the sum of the dislocation densities is divided by the number of the squares, thereby determining the average value of the dislocation density of the main surface. Further, the above-described dislocation-free ratio is calculated by determining the ratio of the number of the squares in each of which no dislocation is present to the total number of the squares constituting imaginary grid G. In the present specification, the expression "laying out the squares on the main surface such that the largest number of the squares are arranged side by side without overlapping with each other" means that: in the case where the squares are laid out on main surface 11 such that the squares are arranged side by side without overlapping with each other, when a square overlaps with the outer periphery and outer side of main surface 11, the square is excluded from the elements constituting imaginary grid G. This is due to the following reason: a fluctuation in the number of dislocations in a region in the vicinity of the outer periphery, which includes the outer periphery and the like of main surface 11 of GaAs single crystal substrate 1, is large among substrates and such a region is normally not used as a material of a semiconductor device.

The average dislocation density of the main surface is preferably 10 cm$^{-2}$ or more and 90 cm$^{-2}$ or less, and is more preferably 15 cm$^{-2}$ or more and 80 cm$^{-2}$ or less. Further, the dislocation-free ratio is preferably 97.0% or more and 99.4% or less, and is more preferably 97.5% or more and 99.4% or less. Thus, it is possible to provide a GaAs single crystal substrate further improved in element yield.

Here, a manner in which the plurality of dislocations t exhibited in main surface 11 of GaAs single crystal substrate 1 shown in FIG. 1 are present in series as the etch pits is referred to as slip line S. Slip line S is a crystal defect introduced due to thermal stress at the time of producing the single crystal. Slip line S is the bundle of the plurality of dislocations t and is caused by slip of atoms along a (111) plane of the GaAs single crystal. Therefore, when the crystal plane of main surface 11 is the {100} plane of the GaAs single crystal, slip line S tends to be present along any one direction selected from a group consisting of four directions equivalent to the [01−1] direction of the GaAs single crystal. In particular, in GaAs single crystal substrate 1 shown in FIG. 1, slip line S is present in each of all the four directions equivalent to the [01−1] direction of the GaAs single crystal so as to extend from the outer periphery of main surface 11 toward the inner side of main surface 11.

In the GaAs single crystal substrate, the crystal plane of the main surface is preferably the {100} plane of the GaAs single crystal. In this case, the dislocation is preferably included in the slip line. The slip line is present along at least one direction selected from the group consisting of the four directions equivalent to the [01−1] direction of the GaAs single crystal, so as to extend from the outer periphery of the main surface toward the inner side of the main surface. Thus, the element yield can be improved in the GaAs single crystal substrate including the slip line.

Alternatively, the crystal plane of the main surface is preferably a plane having an off angle of more than 0° and 3° or less with respect to the {100} plane of the gallium arsenide single crystal. In this case, the off direction of the plane having the off angle is preferably a [011] direction. Also when the plane having the off angle includes the slip line, the slip line is present along at least one direction selected from the group consisting of the four directions equivalent to the [01−1] direction of the GaAs single crystal, so as to extend from the outer periphery of the main surface toward the inner side of the main surface.

It should be noted that in the present disclosure, the crystal plane of the main surface has a precision error of ±0.5°. For example, when the main surface is the "{100} plane" of the GaAs single crystal, it means that the main surface may be exactly {100}-oriented plane, and that the main surface may have an off angle of −0.5 to +0.5° with respect to the {100} plane. The off angle of the main surface of the GaAs single crystal substrate with respect to the {100} plane can be measured by using a conventionally known crystal orientation measurement apparatus (for example, trade name (product number): "2991G2" provided by Rigaku). The four directions equivalent to the [01−1] direction of the GaAs single crystal refer to the [01−1] direction, [0−1−1] direction, [0−11] direction, and [011] direction of the GaAs single crystal.

<Diameter>

The diameter of the GaAs single crystal substrate is 70 mm or more. In particular, the diameter of the GaAs single crystal substrate is preferably 70 mm or more and 210 mm or less. Specifically, in the GaAs single crystal substrate having the diameter of 70 mm or more and 210 mm or less, the diameter is preferably 70 mm, 100 mm, 150 mm, or 210 mm, in other words, 3 inches, 4 inches, 6 inches, or 8 inches. Thus, the element yield can be improved in such a large-diameter GaAs single crystal substrate having a diameter of 70 mm or more and 210 mm or less. Here, even when the main surface does not have a geometric circular shape due to the influence of the OF, IF, and the like, the diameter of the GaAs single crystal substrate is determined based on the circular shape before the OF, IF, or the like is formed. Moreover, the diameter of the GaAs single crystal substrate can be measured by using a conventionally known outer diameter measurement apparatus such as a caliper as described above.

<Dopant>

The GaAs single crystal substrate according to the present embodiment includes silicon (Si). The atomic concentration of the Si is $1.0 \times 10^{18}$ cm$^{-3}$ or more and $5.0 \times 10^{19}$ cm$^{-3}$ or less. The atomic concentration of the Si is preferably $1.4 \times 10^{18}$ cm$^{-3}$ or more and $2.0 \times 10^{19}$ cm$^{-3}$ or less, and is more preferably $1.8 \times 10^{18}$ cm$^{-3}$ or more and $1.0 \times 10^{19}$ cm$^{-3}$ or less. Thus, n type (electron donating type) property can be imparted to the GaAs single crystal substrate as a conductivity type and an effect of reducing the dislocation density can be obtained.

The GaAs single crystal substrate preferably includes boron (B). In this case, the atomic concentration of the B is preferably $1.0 \times 10^{18}$ cm$^{-3}$ or more and $1.0 \times 10^{19}$ cm$^{-3}$ or less. The atomic concentration of the B is more preferably $2.0 \times 10^{18}$ cm$^{-3}$ or more and $8.0 \times 10^{18}$ cm$^{-3}$ or less. Thus, the GaAs single crystal substrate can have a smaller number of dislocations. Each of the atomic concentrations of the Si and the B in the GaAs single crystal substrate is measured by using glow discharge mass spectrometry (GDMS). When the GaAs single crystal substrate is obtained in accordance with a below-described method of producing the GaAs single crystal substrate, the B can be generated by a reaction between silicon added to gallium arsenide serving as the source material and boron oxide serving as a sealing material. In this way, the B can be included in the GaAs single crystal substrate.

<Carrier Concentration>

The carrier concentration of the GaAs single crystal substrate is $1.0 \times 10^{18}$ cm$^{-3}$ or more and $4.0 \times 10^{18}$ cm$^{-3}$ or less. The carrier concentration is preferably $1.2 \times 10^{18}$ cm$^{-3}$ or more and $3.8 \times 10^{18}$ cm$^{-3}$ or less, and is more preferably $1.4 \times 10^{18}$ cm$^{-3}$ or more and $3.6 \times 10^{18}$ cm$^{-3}$ or less. Thus, the n type (electron donating type) property is imparted to the GaAs single crystal substrate as a conductivity type. The carrier concentration of the GaAs single crystal substrate is determined by applying the Van der Pauw method at a room temperature of 25° C. to a rectangular piece obtained by cleavage at the {011} plane from the vicinity of the center of the main surface. The size of the rectangular piece is, for example, a length of 20 mm×a width of 20 mm×a thickness of 1 mm.

[Method of Producing Gallium Arsenide Single Crystal Substrate]

The method of producing the gallium arsenide single crystal substrate (GaAs single crystal substrate) according to the present embodiment can be, for example, a method of producing the above-described GaAs single crystal substrate having the main surface having the circular shape. That is, the production method is a method of producing a GaAs single crystal substrate having a main surface having a circular shape, and includes: a step of obtaining a GaAs single crystal by performing crystal growth using a gallium arsenide single crystal growth apparatus (GaAs single crystal growth apparatus); and a step of obtaining the GaAs single crystal substrate by processing the GaAs single crystal. The GaAs single crystal growth apparatus includes a crucible, a crucible holding base that holds the crucible, and a heating element that heats the crucible. The crucible includes a seed crystal accommodation portion having a cylindrical shape, an increased-diameter portion connected to the seed crystal accommodation portion, and a straight barrel portion connected to the increased-diameter portion. The seed crystal accommodation portion has a hollow portion, the hollow portion being opened on a side on which the seed crystal accommodation portion is connected to the increased-diameter portion, the hollow portion being provided with a bottom wall formed on a side opposite to the increased-diameter portion. The increased-diameter portion has a truncated conical shape having a diameter that is increased upward in an axial direction of the crucible, and is connected to the seed crystal accommodation portion on a small diameter side of the increased-diameter portion. The straight barrel portion has a hollow cylindrical shape and is connected to a large-diameter side of the increased-diameter portion. The crucible holding base holds the increased-diameter portion without contact with the straight barrel portion. When an inner diameter of the straight barrel portion is represented by D1 and an outer diameter of the crucible holding base is represented by D2, D1 and D2 satisfy a relation of 1.0<D2/D1<1.5, and a unit of each of D1 and D2 is mm. According to the method of producing the GaAs single crystal substrate with such a feature, a GaAs single crystal substrate improved in element yield can be obtained.

Figure 3:
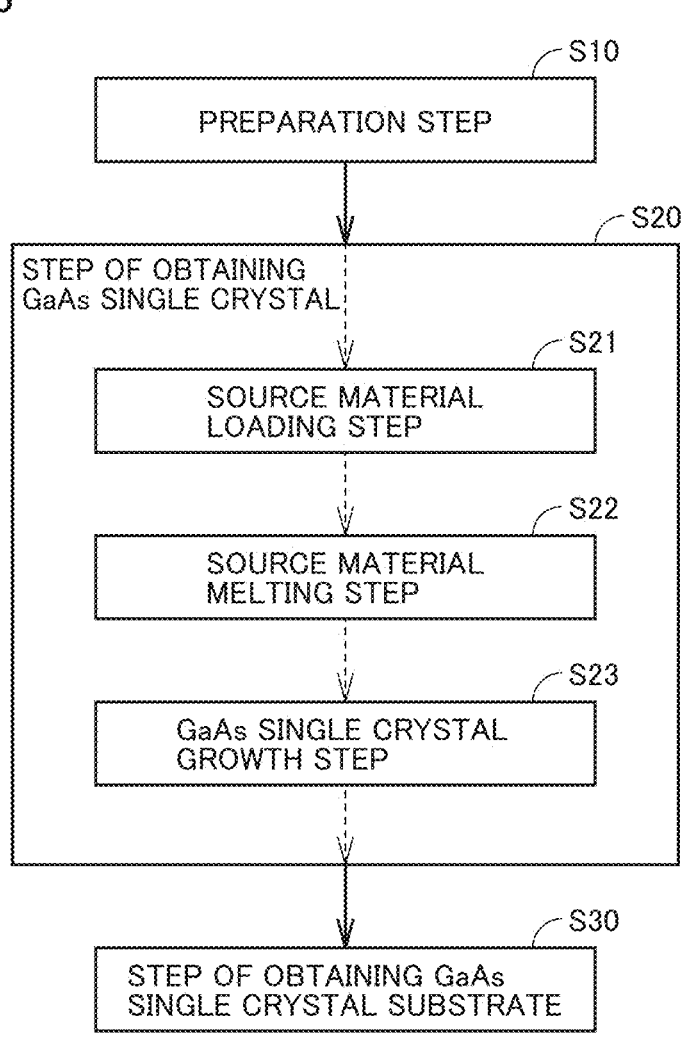
FIG. 3 is a flowchart showing an exemplary method of producing the gallium arsenide single crystal substrate according to the present embodiment.

Specifically, the above-described production method preferably has steps as shown in the flowchart of FIG. 3, for example. FIG. 3 is a flowchart showing an exemplary method of producing the gallium arsenide single crystal substrate according to the present embodiment. According to FIG. 3, the method of producing the GaAs single crystal substrate can include a step S10 (first step: preparation step) of preparing a GaAs single crystal growth apparatus, a seed crystal, and gallium arsenide in the form of a lump; a step S20 (second step: step of obtaining a GaAs single crystal) of obtaining a GaAs single crystal by performing crystal growth using the GaAs single crystal growth apparatus; and a step S30 (third step: step of obtaining the GaAs single crystal substrate) of obtaining the GaAs single crystal substrate by processing the GaAs single crystal. Further, step S20 of obtaining the GaAs single crystal can include: a step (source material loading step S21) of accommodating the seed crystal into the seed crystal accommodation portion and accommodating the gallium arsenide in the form of a lump together with silicon into each of the increased-diameter portion and the straight barrel portion; a step (source material melting step S22) of melting a part of the seed crystal and the gallium arsenide into a gallium arsenide melt (GaAs melt) by heating the crucible using the heating element and bringing the GaAs melt into contact with a remainder of the seed crystal; and a step (GaAs single crystal growth step S23) of performing crystal growth of the GaAs single crystal from the GaAs melt on the remainder of the seed crystal.

In particular, the step (GaAs single crystal growth step S23) of performing the crystal growth is preferably performed while performing control such that a value obtained by performing second-order differentiation onto a temperature at an interface between the GaAs single crystal and the GaAs melt becomes 0.003° C./mm$^2$ or more and 0.012° C./mm$^2$ or less, the second-order differentiation being performed at a position of the interface in an axial direction of the crucible. A positive direction of the position is a direction from a lower side of the crucible toward an upper side of the crucible along the axial direction. Thus, a GaAs single crystal substrate further improved in element yield can be obtained. A concentration of the silicon in the GaAs single crystal substrate is preferably 1.0×10$^{18}$ cm$^{-3}$ or more and 5.0×10$^{19}$ cm$^{-3}$ or less.

The present inventors have paid attention to a structure of the crucible holding base included in the GaAs single crystal growth apparatus that performs the crystal growth of the GaAs single crystal serving as a source material for the GaAs single crystal substrate. Specifically, the present inventors have configured the crucible holding base to have a structure that holds the increased-diameter portion of the crucible without contact with the straight barrel portion of the crucible, and have configured the outer diameter of the crucible holding base to satisfy the predetermined relation (such a relation that inner diameter D1 of the straight barrel portion and outer diameter D2 of the crucible holding base is 1.0<D2/D1<1.5) with the inner diameter of the straight barrel portion of the crucible. Thus, heat radiation from inside of the crucible to outside of the crucible was prevented, thereby strictly controlling the temperature at the position of the interface between the GaAs single crystal grown in the crucible and the GaAs melt. As a result, heat distribution in the GaAs single crystal can be uniform, thereby realizing suppression of occurrence of dislocations that are based on thermal strains. With this as well as the effect of reducing the dislocation density by doping with silicon, the present inventors have arrived at a GaAs single crystal having a very small number of dislocations, and accordingly have conceived to produce a GaAs single crystal substrate allowing for improved element yield.

Figure 4:
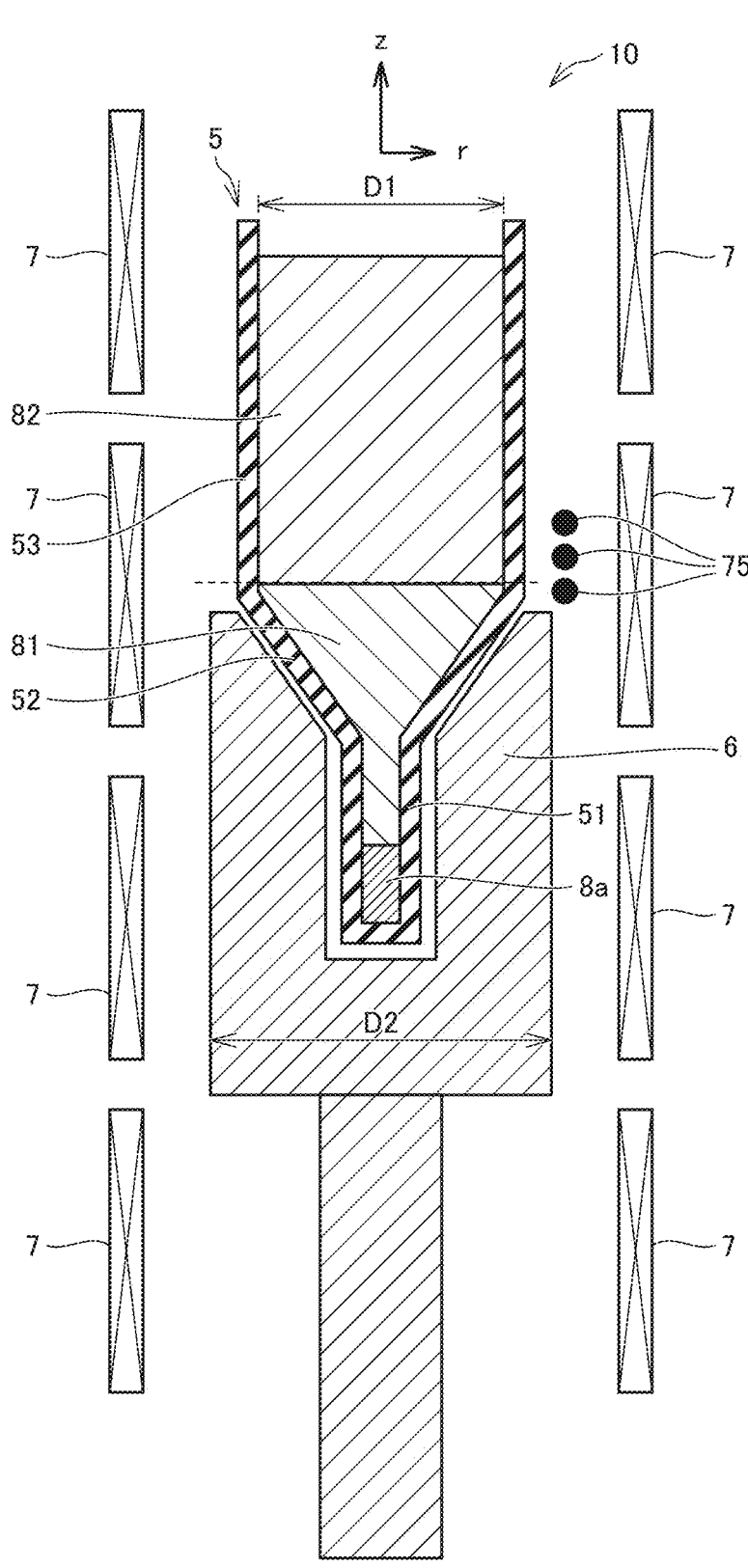
FIG. 4 is an explanatory view illustrating a step of obtaining a gallium arsenide single crystal using a single crystal growth apparatus in the method of producing the gallium arsenide single crystal substrate according to the present embodiment.

Hereinafter, an overview of the GaAs single crystal growth apparatus and each step included in the production method will be described with reference to FIG. 4. FIG. 4 is an explanatory view illustrating the step of obtaining the gallium arsenide single crystal using the single crystal growth apparatus in the method of producing the gallium arsenide single crystal substrate according to the present embodiment. In the method of producing the GaAs single crystal substrate according to the present embodiment, for example, a GaAs single crystal growth apparatus 10 shown in FIG. 4 is employed. GaAs single crystal growth apparatus 10 includes a crucible 5, a crucible holding base 6 that holds crucible 5, and a heating element 7 that heats crucible 5. GaAs single crystal growth apparatus 10 can grow a single crystal in accordance with a vertical boat method using the crucible. Hereinafter, the vertical boat method will be abbreviated as VB method. The VB method includes a Vertical Bridgman method and a vertical temperature gradient solidification method.

<GaAs Single Crystal Growth Apparatus>
(Crucible)

As shown in FIG. 4, in GaAs single crystal growth apparatus 10, crucible 5 includes a seed crystal accommodation portion 51 having a cylindrical shape, an increased-diameter portion 52 connected to seed crystal accommodation portion 51, and a straight barrel portion 53 connected to increased-diameter portion 52. Seed crystal accommodation portion 51 has a cylindrical shape, and has a hollow portion, the hollow portion being opened on a side on which seed crystal accommodation portion 51 is connected to increased-diameter portion 52, the hollow portion being provided with a bottom wall formed on a side opposite to increased-diameter portion 52. Seed crystal accommodation portion 51 can accommodate and hold a seed crystal 8a in the hollow portion. Increased-diameter portion 52 has a truncated conical shape having a diameter that is increased upward in an axial direction of crucible 5, and is connected to seed crystal accommodation portion 51 on a small diameter side of increased-diameter portion 52. Straight barrel portion 53 has a hollow cylindrical shape and is connected to a large-diameter side of increased-diameter portion 52. Each of increased-diameter portion 52 and straight barrel portion 53 has a function of holding the gallium arsenide (specifically, polycrystalline gallium arsenide) in the form of a lump therein. Further, each of increased-diameter portion 52 and straight barrel portion 53 has a function of allowing for crystal growth of GaAs single crystal 81 as a crystalline solid by solidifying a GaAs melt 82 that is a molten state of the gallium arsenide as described later. As crucible 5, various materials, each of which can endure the temperature of GaAs melt 82, are used. For example, pyrolytic boron nitride (pBN) can be employed as the material of crucible 5. Inner diameter D1 of straight barrel portion 53 is, for example, 70 mm or more and 215 mm or less although it depends on the diameter of the GaAs single crystal to be produced.

(Crucible Holding Base)

GaAs single crystal growth apparatus 10 includes crucible holding base 6 that holds crucible 5. Crucible holding base 6 has a cylindrical appearance. In particular, crucible holding base 6 holds increased-diameter portion 52 without contact with straight barrel portion 53. As the material of crucible holding base 6, for example, quartz, alumina, silicon carbide, or the like can be employed. Outer diameter D2 of crucible holding base 6 is, for example, 72 mm or more and 320 mm or less although it depends on the diameter of the GaAs single crystal to be produced.

In GaAs single crystal growth apparatus 10, crucible 5 and crucible holding base 6 have the following relation. That is, when the inner diameter of straight barrel portion 53 of crucible 5 is represented by D1 and the outer diameter of crucible holding base 6 is represented by D2, D1 and D2 satisfy the relation of 1.0<D2/D1<1.5. Here, the unit of each of D1 and D2 is mm. D1 and D2 preferably satisfy a relation of 1.05<D2/D1<1.3. As described above, D1 is preferably 70 mm or more and 215 mm or less, and D2 is preferably 72 mm or more and 320 mm or less. Thus, the element yield can be improved in such a so-called large-diameter gallium arsenide single crystal substrate having a diameter of 70 mm or more and 210 mm or less.

(Heating Element)

GaAs single crystal growth apparatus 10 includes heating element 7 that heats crucible 5. Heating element 7 consists of two elements. These two elements are disposed to surround the outer periphery of crucible 5. Each element of heating element 7 is divided into a plurality of portions in a direction perpendicular to the axis of the crucible. Thus, heating element 7 is formed to have multiple stages in each element of heating element 7. An output of heating element 7 can be independently controlled for each element and for each portion. Thus, it is possible to strictly control the temperature at the position of the interface between GaAs single crystal 81 and GaAs melt 82. As heating element 7, for example, a known electric heater can be employed.

GaAs single crystal growth apparatus 10 can include thermocouples 75 that each can measure the temperature of crucible 5 heated by heating element 7. The plurality of thermocouples 75 are disposed outside crucible 5 along the axial direction thereof. In particular, the plurality of thermocouples 75 are preferably disposed outside crucible 5 at least at a height approximately corresponding to the interface between GaAs single crystal 81 and GaAs melt 82 in crucible 5 in the axial direction of crucible 5. Based on the temperature measured by each thermocouple 75, the temperature of each position of GaAs single crystal 81 that undergoes crystal growth in crucible 5 can be estimated, and a value (hereinafter, also referred to as "second-order differential value") obtained by performing second-order differentiation onto a temperature at the interface can also be determined, the second-order differentiation being performed at a position of the interface in the axial direction of crucible 5. In the present embodiment, the second-order differential value is controlled to become 0.003° C./mm$^2$ or more and 0.012° C./mm$^2$ or less as described in the below-described step of performing the crystal growth. As each of thermocouples 75, for example, a known temperature monitor can be employed. It should be noted that the second-order differential value can be expressed as "$d^2T/dz^2$". T represents the temperature (its unit is ° C.) at the interface, and z represents the position (its unit is mm) in the axial direction of crucible 5. A positive direction of the z means a direction from the lower side of crucible 5 toward the upper side of crucible 5 along the axial direction of crucible 5 as shown in FIG. 4. A direction of r shown in FIG. 4 means a radial direction of crucible 5.

<Steps Included in Method of Producing GaAs Single Crystal Substrate>

(First Step: Preparation Step S10)

As shown in FIG. 3, in the method of producing the GaAs single crystal substrate according to the present embodiment, first, preparation step S10 is performed as the first step. In preparation step S10, GaAs single crystal growth apparatus 10, seed crystal 8a, and the gallium arsenide in the form of a lump for producing the GaAs single crystal serving as a source material for the GaAs single crystal substrate are prepared. Seed crystal 8a is composed of a GaAs single crystal. Each of seed crystal 8a and the gallium arsenide in the form of a lump may be prepared by a conventionally known method, or may be prepared by obtaining a commercially available product.

(Second Step: Step S20 of Obtaining GaAs Single Crystal)

Next, in the method of producing the GaAs single crystal substrate according to the present embodiment, step S20 of obtaining the GaAs single crystal by performing the crystal growth using the GaAs single crystal growth apparatus is performed. Step S20 of obtaining the GaAs single crystal includes a source material loading step S21, a source material melting step S22, and a GaAs single crystal growth step S23 as described below. In step S20 of obtaining the GaAs single crystal, these steps are performed in this order.

1) Source Material Loading Step S21

Source material loading step S21 is a step of accommodating the seed crystal into the seed crystal accommodation portion and accommodating the gallium arsenide in the form of a lump together with silicon into each of the increased-diameter portion and the straight barrel portion. Source material loading step S21 includes a seed crystal loading step, a gallium arsenide loading step, and a sealing material placement step. As shown in FIG. 4, in the seed crystal loading step, seed crystal 8a composed of GaAs is loaded into the hollow portion of seed crystal accommodation portion 51 of crucible 5. As a method of loading seed crystal 8a into seed crystal accommodation portion 51, a conventionally known method can be used. In the gallium arsenide loading step, a plurality of lumps each composed of polycrystalline GaAs are loaded into each of increased-diameter portion 52 and straight barrel portion 53 of crucible 5 as the gallium arsenide in the form of a lump, and are stacked on each other. Further, in the gallium arsenide loading step, a predetermined amount of silicon is added to each of increased-diameter portion 52 and straight barrel portion 53 of crucible 5 such that the concentration of silicon in the GaAs single crystal substrate to be obtained by the present production method becomes 1.0×10$^{18}$ cm$^{-3}$ or more and 5.0×10$^{19}$ cm$^{-3}$ or less. In the sealing material placement step, a conventionally known sealing material (for example, a solid sealing material composed of B$_2$O$_3$ (boron oxide)) in the VB method is placed on each of the lumps.

2) Source Material Melting Step S22

Source material melting step S22 is a step of melting a part of seed crystal 8a and the lump composed of polycrystalline GaAs into GaAs melt 82 by heating crucible 5 using heating element 7, and bringing GaAs melt 82 into contact with the remainder of seed crystal 8a. In this step, seed crystal 8a and GaAs melt 82 are brought into contact with each other for the purpose of obtaining GaAs single crystal 81. Thus, in the next step of the present production method, crystal growth of GaAs single crystal 81 will be attained on the remainder of seed crystal 8a. Specifically, in source material melting step S22, crucible 5 in which seed crystal 8a, the lump composed of GaAs polycrystal, and the solid sealing material are placed is supported by crucible holding base 6. Thereafter, a current is supplied to heating element 7 to heat crucible 5. Thus, the solid sealing material is melted to become a liquid sealing material (not shown in FIG. 4), and the lump is melted to become GaAs melt 82. Next, a part of seed crystal 8a is also melted, and the remainder of seed crystal 8a and GaAs melt 82 are brought into contact with each other at the interface therebetween.

3) GaAs Single Crystal Growth Step S23

GaAs single crystal growth step S23 is a step of performing crystal growth of GaAs single crystal 81 from GaAs melt 82 on the remainder of seed crystal 8a. In GaAs single crystal growth step S23, for example, by gradually pulling down crucible 5 (toward the seed crystal accommodation portion 51 side) along the axis thereof with respect to heating element 7, it is possible to form a temperature gradient in which a temperature on the seed crystal 8a side is low and a temperature on the GaAs melt 82 side is high in crucible 5. Thus, GaAs melt 82 in contact with seed crystal 8a is solidified, with the result that the crystal growth of GaAs single crystal 81 is continuously performed from GaAs melt 82 on the remainder of seed crystal 8a. A speed of pulling down crucible 5 along its axis is not particularly limited, but can be, for example, 1 to 5 mm/hour.

Here, crucible holding base 6 holds increased-diameter portion 52 without contact with straight barrel portion 53 of crucible 5. Regarding crucible 5 and crucible holding base 6 in GaAs single crystal growth apparatus 10, when the inner diameter of straight barrel portion 53 is represented by D1 and the outer diameter of crucible holding base 6 is represented by D2, D1 and D2 satisfy the relation of 1.0<D2/D1<1.5. The unit of each of D1 and D2 is mm. Thus, in GaAs single crystal growth step S23, control can be performed such that the second-order differential value obtained by performing the second-order differentiation onto the temperature at the interface between GaAs single crystal 81 and GaAs melt 82 becomes 0.003° C./mm² or more and 0.012° C./mm² or less, the second-order differentiation being performed at a position of the interface in the axial direction of crucible 5. The positive direction of the position in the axial direction of crucible 5 is a direction from the lower side of crucible 5 toward the upper side of crucible 5 along the axial direction. When the second-order differential value is less than 0.003° C./mm², the dislocation-free ratio becomes very high, with the result that the processing yield may be deteriorated due to cracking, chipping, or the like at the time of processing the GaAs single crystal substrate. When the second-order differential value is more than 0.012° C./mm², suppression of occurrence of dislocations that are based on thermal strains may be insufficient. The second-order differential value is preferably controlled such that the absolute value thereof becomes 0.003° C./mm² or more and 0.012° C./mm² or less. The second-order differential value is preferably controlled to be 0.004° C./mm² or more and 0.008° C./mm² or less, and is also preferably controlled to be −0.008° C./mm² or more and −0.004° C./mm² or less. In this way, in GaAs single crystal growth step S23, the crystal growth of GaAs single crystal 81 can be performed while controlling the heat distribution in GaAs single crystal 81 to be uniform. Thus, it is possible to suppress the occurrence of dislocations that are based on thermal strains in GaAs single crystal 81.

When D2/D1 is 1.0 or less, heat radiation from the inside of crucible 5 to the outside of crucible 5 tends not to be sufficiently suppressed. Thus, the occurrence of dislocations that are based on thermal strains in GaAs single crystal 81 may not be unable to be sufficiently suppressed. When D2/D1 is 1.5 or more, the occurrence of dislocations that are based on thermal strains in GaAs single crystal 81 can be sufficiently suppressed; however, the output of heating element 7 is increased, thus presumably resulting in poor economic rationality.

In GaAs single crystal growth step S23, by continuously pulling down crucible 5 with respect to heating element 7 along the axis thereof, the interface between GaAs single crystal 81 and GaAs melt 82 can be raised to the liquid sealing material side and GaAs melt 82 can be solidified. Thus, the crystal growth of GaAs single crystal 81 can be attained upward along the axis of crucible 5. The crystal growth of GaAs single crystal 81 is continued until the solidification of GaAs melt 82 remaining in straight barrel portion 53 of crucible 5 is completed. In this way, the ingot of GaAs single crystal 81 can be obtained.

(Third Step: Step S30 of Obtaining GaAs Single Crystal Substrate)

Next, in the method of producing the GaAs single crystal substrate according to the present embodiment, step S30 of obtaining the GaAs single crystal substrate by processing the GaAs single crystal is performed. Step S30 of obtaining the GaAs single crystal substrate includes a cutting step, an outer periphery grinding step, and a polishing step as described below, and the GaAs single crystal substrate can be obtained by performing these steps in this order.

The cutting step is a step of slicing the ingot into a wafer having a predetermined thickness in order to obtain the GaAs single crystal substrate from the ingot composed of the GaAs single crystal taken out from crucible 5. Further, the outer periphery grinding step is a step of grinding the outer periphery of the wafer to obtain a GaAs single crystal substrate having a main surface having a circular shape. For the cutting step and the outer periphery grinding step, conventionally known cutting method and outer periphery grinding method can be used. Further, the polishing step is a step of forming the main surface into a mirror surface. For the polishing step, a conventionally known polishing method can be used. With the polishing step, the main surface can have, for example, a surface roughness Sa of 0.3 nm or less, surface roughness Sa being defined in JIS B 0681-2:2018.

<Functions and Effects>

By performing the above steps, a GaAs single crystal substrate having a main surface having a circular shape is produced. In the method of producing the GaAs single crystal substrate according to the present embodiment, in particular, in the second step, the crystal growth of GaAs single crystal 81 can be performed to attain uniform heat distribution in GaAs single crystal 81. With this as well as the effect of reducing the dislocation density by doping with silicon, a GaAs single crystal having a very small number of dislocations can be produced. In this way, according to the present disclosure, it is possible to obtain a GaAs single crystal substrate allowing for improved element yield.

Examples

Hereinafter, the present disclosure will be described more in detail with reference to examples, but the present disclosure is not limited thereto. In the present example, the present inventors used the GaAs single crystal growth apparatus as shown in FIG. 4 so as to perform crystal growth of a GaAs single crystal in accordance with the Vertical Bridgman method with the <100> direction being set as the growth direction. Further, a GaAs single crystal substrate having a main surface having a plane orientation of a {100} plane was obtained from the ingot of the GaAs single crystal. In the description below, samples 11 to 14, samples 21 to 24, samples 31 to 34, and samples 41 to 44 are examples of the present disclosure, and samples 111 to 113, samples 121 to 123, samples 131 to 134, and samples 141 to 143 are comparative examples.

[Production of GaAs Single Crystal Substrate]

First, GaAs single crystal substrates of samples 11 to 14 and samples 111 to 113 each having a diameter of 76 mm were prepared in the following manner.

<Sample 11>

(First Step: Preparation Step S10)

Each of GaAs single crystal growth apparatus 10, seed crystal 8a composed of a GaAs single crystal, and each of the lumps composed of a GaAs polycrystal as shown in FIG. 4 was prepared by a known method. Here, a relation between straight barrel portion 53 of crucible 5 and crucible holding base 6 in GaAs single crystal growth apparatus 10 was set as follows. That is, when the inner diameter of straight barrel portion 53 of crucible 5 is represented by D1 and the outer diameter of crucible holding base 6 is represented by D2, D2/D1 was set to be 1.05. Further, inner diameter D1 of straight barrel portion 53 of crucible 5 was 82 mm. Outer diameter D2 of crucible holding base 6 was 86.1 mm.

(Second Step: Step S20 of Obtaining GaAs Single Crystal)

1) Source Material Loading Step S21

Seed crystal 8a was loaded into the hollow portion in seed crystal accommodation portion 51 of crucible 5 provided in GaAs single crystal growth apparatus 10 by using a conventionally known method. Further, the plurality of lumps each composed of polycrystalline GaAs were loaded into increased-diameter portion 52 and straight barrel portion 53 of crucible 5 and they were stacked on each other. A small amount of silicon (Si) was also added. Further, the sealing material composed of $B_2O_3$ was placed on the each of the lumps.

2) Source Material Melting Step S22

A current was supplied to heating element 7 to heat crucible 5, with the result that the sealing material was formed into a liquid sealing material and the polycrystalline GaAs loaded in each of increased-diameter portion 52 and straight barrel portion 53 was formed into GaAs melt 82. Further, by controlling heating element 7 that heats seed crystal accommodation portion 51, a part of seed crystal 8a in the hollow portion of seed crystal accommodation portion 51 was also melted. Thus, the remainder of seed crystal 8a and GaAs melt 82 were brought into contact with each other.

3) GaAs Single Crystal Growth Step S23

The output of heating element 7 that heats crucible 5 was controlled, and crucible 5 was gradually pulled down (toward the seed crystal accommodation portion 51 side) along the axis thereof with respect to heating element 7, thereby forming a temperature gradient in which a temperature on the seed crystal 8a side was low and a temperature on the GaAs melt 82 side was high in crucible 5. Thus, the crystal growth of GaAs single crystal 81 was continuously performed from GaAs melt 82 on the remainder of seed crystal 8a. On this occasion, control is performed such that the second-order differential value obtained by performing second-order differentiation onto the temperature at the interface between GaAs single crystal 81 and GaAs melt 82 became $0.011° \text{ C./mm}^2$, the second-order differentiation being performed at a position of the interface in the axial direction of crucible 5. It should be noted that crucible 5 was pulled down along the axis thereof at a speed of 2 mm/hour.

Continuously, the output of heating element 7 that heats crucible 5 was controlled and crucible 5 was pulled down along the axis thereof with respect to heating element 7 so as to solidify GaAs melt 82, with the result that the crystal growth of GaAs single crystal 81 was performed upward along the axis of crucible 5. Thereafter, the crystal growth of GaAs single crystal 81 was continued until the solidification of GaAs melt 82 remaining in straight barrel portion 53 of crucible 5 was completed, thereby obtaining the ingot of GaAs single crystal 81.

(Third Step: Step S30 of Obtaining GaAs Single Crystal Substrate)

By using conventionally known cutting method and outer peripheral grinding method, a wafer having a predetermined thickness was obtained from the ingot of GaAs single crystal 81 taken out from crucible 5, and then a GaAs single crystal substrate having a main surface having a circular shape was obtained from the wafer. Further, the main surface of the GaAs single crystal substrate was polished by a conventionally known method into a mirror surface. Thus, a GaAs single crystal substrate having a diameter of 76 mm was obtained as sample 11. Surface roughness Sa of the main surface of the GaAs single crystal substrate was measured to be 0.15 nm by the above-described measurement method.

<Samples 12 to 14 and Samples 111 to 113>

Each of GaAs single crystal substrates of samples 12 to 14 and samples 111 to 113 was obtained in the same manner as in sample 11 except that inner diameter D1 of straight barrel portion 53 of crucible 5 provided in GaAs single crystal growth apparatus 10 was changed to 82 mm and outer diameter D2 of crucible holding base 6 was changed such that D2/D1 had a value shown in Table 1 in preparation step S10, and the output of heating element 7 was controlled such that the second-order differential value became a value shown in Table 1 in GaAs single crystal growth step S23. Surface roughness Sa of the main surface of the GaAs single crystal substrate was measured to be 0.15 nm by the above-described measurement method.

Next, GaAs single crystal substrates of samples 21 to 24 and samples 121 to 123 each having a diameter of 100 mm were prepared in the following manner.

<Sample 21>

The GaAs single crystal substrate of sample 21 was obtained in the same manner as in sample 11, except that inner diameter D1 of straight barrel portion 53 of crucible 5 provided in GaAs single crystal growth apparatus 10 was changed to 106 mm and outer diameter D2 of crucible holding base 6 was changed to 111.3 mm in preparation step S10, and the output of heating element 7 was controlled such that the second-order differential value became $0.012° \text{ C./mm}^2$ in GaAs single crystal growth step S23. Surface roughness Sa of the main surface of the GaAs single crystal substrate was measured to be 0.15 nm by the above-described measurement method.

<Samples 22 to 24 and Samples 121 to 123>

Each of the GaAs single crystal substrates of samples 22 to 24 and samples 121 to 123 were obtained in the same manner as in sample 21, except that inner diameter D1 of straight barrel portion 53 of crucible 5 provided in GaAs single crystal growth apparatus 10 was changed to 106 mm and outer diameter D2 of crucible holding base 6 was changed such that D2/D1 became a value shown in Table 2 in preparation step S10, and the output of heating element 7 was controlled such that the second-order differential value became a value shown in Table 2 in GaAs single crystal growth step S23. Surface roughness Sa of the main surface of the GaAs single crystal substrate was measured to be 0.15 nm by the above-described measurement method.

Next, GaAs single crystal substrates of samples 31 to 34 and samples 131 to 134 each having a diameter of 150 mm were prepared in the following manner.

<Sample 31>

The GaAs single crystal substrate of sample 31 was obtained in the same manner as in sample 11, except that inner diameter D1 of straight barrel portion 53 of crucible 5 provided in GaAs single crystal growth apparatus 10 was changed to 156 mm and outer diameter D2 of crucible holding base 6 was changed to 163.8 mm in preparation step S10, and the output of heating element 7 was controlled such that the second-order differential value was $0.010° \text{ C./mm}^2$ in GaAs single crystal growth step S23. Surface roughness Sa of the main surface of the GaAs single crystal substrate was measured to be 0.15 nm by the above-described measurement method.

<Samples 32 to 34, and Samples 131 to 133>

Each of the GaAs single crystal substrates of samples 32 to 34 and samples 131 to 133 were obtained in the same manner as in sample 31, except that inner diameter D1 of straight barrel portion 53 of crucible 5 provided in GaAs single crystal growth apparatus 10 was changed to 156 mm and outer diameter D2 of crucible holding base 6 was changed such that D2/D1 became a value shown in Table 3 in preparation step S10, and the output of heating element 7 was controlled such that the second-order differential value became a value shown in Table 3 in GaAs single crystal growth step S23. Surface roughness Sa of the main surface of the GaAs single crystal substrate was measured to be 0.15 nm by the above-described measurement method.

<Sample 134>

The GaAs single crystal substrate of sample 134 was obtained in the same manner as in sample 34, except that the amount of Si, which was added in a small amount in source material loading step S21, was reduced, and the output of heating element 7 was controlled such that the second-order differential value became a value shown in Table 3 in GaAs single crystal growth step S23. Surface roughness Sa of the main surface of the GaAs single crystal substrate was measured to be 0.15 nm by the above-described measurement method.

Next, GaAs single crystal substrates of samples 41 to 44 and samples 141 to 143 each having a diameter of 200 mm were prepared in the following manner.

<Sample 41>

The GaAs single crystal substrate of sample 41 was obtained in the same manner as in sample 11, except that inner diameter D1 of straight barrel portion 53 of crucible 5 provided in GaAs single crystal growth apparatus 10 was changed to 206 mm and outer diameter D2 of the crucible holding base 6 was changed to 216.3 mm in preparation step S10, and the output of heating element 7 was controlled such that the second-order differential value became 0.012° C./mm$^2$ in GaAs single crystal growth step S23. Surface roughness Sa of the main surface of the GaAs single crystal substrate was measured to be 0.15 nm by the above-described measurement method.

<Samples 42 to 44 and Samples 141 to 143>

Each of the GaAs single crystal substrates of samples 42 to 44 and samples 141 to 143 were obtained in the same manner as in sample 41, except that inner diameter D1 of straight barrel portion 53 of crucible 5 provided in GaAs single crystal growth apparatus 10 was changed to 206 mm and outer diameter D2 of crucible holding base 6 was changed such that D2/D1 became a value shown in Table 4 in preparation step S10, and the output of heating element 7 was controlled such that the second-order differential value became a value shown in Table 4 in GaAs single crystal growth step S23. Surface roughness Sa of the main surface of the GaAs single crystal substrate was measured to be 0.15 nm by the above-described measurement method.

<Property Evaluation>

The above-described measurement method or calculation method was performed onto each of the GaAs single crystal substrates of samples 11 to 14, samples 21 to 24, samples 31 to 34, samples 41 to 44, samples 111 to 113, samples 121 to 123, samples 131 to 134, and samples 141 to 143, thereby determining the atomic concentration of the silicon, the carrier concentration, the atomic concentration of the boron, the average value of the dislocation density, and the dislocation-free ratio in each of the samples. Results are shown in Tables 1 to 4.

<Element Yield>

By using the GaAs single crystal substrates of samples 11 to 14, samples 21 to 24, samples 31 to 34, samples 41 to 44, samples 111 to 113, samples 121 to 123, samples 131 to 134, and samples 141 to 143, VCSELs were produced in accordance with the method disclosed in Japanese Patent Laying-Open No. 2008-283137. In this case, the element yield (%) was determined by multiplying the processing yield by the performance yield, the processing yield indicating a ratio at which a VCSEL-formed wafer including a plurality of VCSEL portions could be obtained from the GaAs single crystal substrate without occurrence of cracking, chipping, or the like during processing, the performance yield indicating a ratio at which VCSELs obtained from the wafer could each satisfy a required predetermined performance. Here, the "performance yield" was evaluated by the following accelerated deterioration test. It should be noted that the "VCSEL portion" refers to an element-like region that is located on the wafer and that can function as a VCSEL as a result of dividing the VCSEL-formed wafer and performing mounting. The size of the VCSEL portion was set to provide a VCSEL having a size of 500 μm in length×500 μm in width at the time of the dividing.

First, before performing the accelerated deterioration test, each VCSEL portion in the VCSEL-formed wafer produced in each sample was subjected to an initial property evaluation in an on-wafer state. In the initial property evaluation, a VCSEL portion having an optical output of 4 mW or more at an operating current of 9 mA was regarded as a non-defective product. Further, a VCSEL portion having an optical output of less than 4 mW at an operating current of 9 mA was marked as a defective portion in the wafer. Next, the wafer was divided into pieces, all of which served as chips. Then, 40 non-defective chips (i.e., unmarked chips) were freely extracted from the chips and mounting was performed, thereby obtaining VCSELs. Further, an applied current of 18 mA was applied to each of the VCSELs for 100 hours at an atmosphere temperature of 80° C., thereby performing the accelerated deterioration test. Thereafter, each VCSEL was returned to room temperature, and the optical output thereof at an operating current of 9 mA was evaluated. In the above evaluation, a VCSEL in which the optical output was decreased by 10% or less from the optical output before the accelerated deterioration test (i.e., the optical output was 3.6 mW or more) was regarded as a non-defective product, and a ratio of the number of non-defective products to the above 40 products was regarded as the performance yield. Results are shown in Tables 1 to 4.

TABLE 1

| | Sample 11 | Sample 12 | Sample 13 | Sample 14 | Sample 111 | Sample 112 | Sample 113 |
|---|---|---|---|---|---|---|---|
| D2/D1 | 1.05 | 1.15 | 1.25 | 1.4 | 0.8 | 1.0 | 1.5 |
| Si Concentration (/cm$^3$) | $2.10 \times 10^{18}$ | $2.20 \times 10^{18}$ | $2.10 \times 10^{18}$ | $2.20 \times 10^{18}$ | $2.00 \times 10^{18}$ | $2.10 \times 10^{18}$ | $2.10 \times 10^{18}$ |
| Carrier Concentration (/cm$^3$) | $1.61 \times 10^{18}$ | $1.61 \times 10^{18}$ | $1.60 \times 10^{18}$ | $1.62 \times 10^{18}$ | $1.59 \times 10^{18}$ | $1.60 \times 10^{18}$ | $1.61 \times 10^{18}$ |
| B Concentration (/cm$^3$) | $2.80 \times 10^{18}$ | $2.85 \times 10^{18}$ | $2.80 \times 10^{18}$ | $2.90 \times 10^{18}$ | $2.60 \times 10^{18}$ | $2.75 \times 10^{18}$ | $2.75 \times 10^{18}$ |
| Second-Order Differential Value (° C./mm$^2$) | 0.011 | 0.008 | 0.007 | 0.005 | 0.024 | 0.015 | 0.002 |

TABLE 1-continued

| | Sample 11 | Sample 12 | Sample 13 | Sample 14 | Sample 111 | Sample 112 | Sample 113 |
|---|---|---|---|---|---|---|---|
| Dislocation Density (Average Value, $cm^{-2}$) | 87 | 56 | 34 | 18 | 233 | 149 | 0 |
| Dislocation-Free Ratio (%) | 97.6 | 98.6 | 98.9 | 99.4 | 90.3 | 95.6 | 100 |
| Element Yield (%) | 89.8 | 90.7 | 90.9 | 91.7 | 77.4 | 78.5 | 79.4 |

TABLE 2

| | Sample 21 | Sample 22 | Sample 23 | Sample 24 | Sample 121 | Sample 122 | Sample 123 |
|---|---|---|---|---|---|---|---|
| D2/D1 | 1.05 | 1.15 | 1.25 | 1.4 | 0.8 | 1.0 | 1.5 |
| Si Concentration (/cm$^3$) | $2.10 \times 10^{18}$ | $2.30 \times 10^{18}$ | $2.10 \times 10^{18}$ | $2.00 \times 10^{18}$ | $2.20 \times 10^{18}$ | $2.10 \times 10^{18}$ | $2.10 \times 10^{18}$ |
| Carrier Concentration (/cm$^3$) | $1.61 \times 10^{18}$ | $1.62 \times 10^{18}$ | $1.60 \times 10^{18}$ | $1.60 \times 10^{18}$ | $1.61 \times 10^{18}$ | $1.62 \times 10^{18}$ | $1.62 \times 10^{18}$ |
| B Concentration (/cm$^3$) | $2.80 \times 10^{18}$ | $2.90 \times 10^{18}$ | $2.80 \times 10^{18}$ | $2.75 \times 10^{18}$ | $2.85 \times 10^{18}$ | $2.85 \times 10^{18}$ | $2.80 \times 10^{18}$ |
| Second-Order Differential Value (° C./mm$^2$) | 0.012 | 0.010 | 0.007 | 0.006 | 0.022 | 0.017 | 0.001 |
| Dislocation Density (Average Value, $cm^{-2}$) | 95 | 69 | 38 | 26 | 202 | 163 | 0 |
| Dislocation-Free Ratio (%) | 97.4 | 98.3 | 98.8 | 99.3 | 91.6 | 93.3 | 100 |
| Element Yield (%) | 87.4 | 89.7 | 90.6 | 91.4 | 73.7 | 75.2 | 77.0 |

TABLE 3

| | Sample 31 | Sample 32 | Sample 33 | Sample 34 | Sample 131 | Sample 132 | Sample 133 | Sample 134 |
|---|---|---|---|---|---|---|---|---|
| D2/D1 | 1.05 | 1.15 | 1.25 | 1.4 | 0.8 | 1.0 | 1.5 | 1.4 |
| Si Concentration (/cm$^3$) | $2.10 \times 10^{18}$ | $2.10 \times 10^{18}$ | $2.20 \times 10^{18}$ | $2.10 \times 10^{18}$ | $2.10 \times 10^{18}$ | $2.30 \times 10^{18}$ | $2.20 \times 10^{18}$ | $8.40 \times 10^{17}$ |
| Carrier Concentration (/cm$^3$) | $1.60 \times 10^{18}$ | $1.60 \times 10^{18}$ | $1.61 \times 10^{18}$ | $1.61 \times 10^{18}$ | $1.60 \times 10^{18}$ | $1.62 \times 10^{18}$ | $1.59 \times 10^{18}$ | $7.50 \times 10^{17}$ |
| B Concentration (/cm$^3$) | $2.70 \times 10^{18}$ | $2.80 \times 10^{18}$ | $2.75 \times 10^{18}$ | $2.90 \times 10^{18}$ | $2.85 \times 10^{18}$ | $2.80 \times 10^{18}$ | $2.80 \times 10^{18}$ | $8.70 \times 10^{17}$ |
| Second-Order Differential Value (° C./mm$^2$) | 0.010 | 0.008 | 0.006 | 0.004 | 0.026 | 0.016 | −0.001 | 0.019 |
| Dislocation Density (Average Value, $cm^{-2}$) | 76 | 65 | 21 | 12 | 281 | 154 | 0 | 176 |
| Dislocation-Free Ratio (%) | 97.7 | 98.2 | 99.2 | 99.4 | 90.3 | 93.6 | 100 | 94.2 |
| Element Yield (%) | 85.5 | 86.6 | 89.6 | 90.4 | 71.1 | 70.2 | 75.2 | 71.2 |

TABLE 4

| | Sample 41 | Sample 42 | Sample 43 | Sample 44 | Sample 141 | Sample 142 | Sample 143 |
|---|---|---|---|---|---|---|---|
| D2/D1 | 1.05 | 1.15 | 1.25 | 1.4 | 0.8 | 1.0 | 1.5 |
| Si Concentration ($/cm^3$) | $2.10 \times 10^{18}$ | $2.00 \times 10^{18}$ | $2.10 \times 10^{18}$ | $2.10 \times 10^{18}$ | $2.20 \times 10^{18}$ | $2.10 \times 10^{18}$ | $2.10 \times 10^{18}$ |
| Carrier Concentration ($/cm^3$) | $1.60 \times 10^{18}$ | $1.59 \times 10^{18}$ | $1.61 \times 10^{18}$ | $1.61 \times 10^{18}$ | $1.62 \times 10^{18}$ | $1.61 \times 10^{18}$ | $1.60 \times 10^{18}$ |
| B Concentration ($/cm^3$) | $2.75 \times 10^{18}$ | $2.70 \times 10^{18}$ | $2.80 \times 10^{18}$ | $2.85 \times 10^{18}$ | $2.90 \times 10^{18}$ | $2.70 \times 10^{18}$ | $2.70 \times 10^{18}$ |
| Second-Order Differential Value ($° C./mm^2$) | 0.012 | 0.010 | 0.006 | 0.005 | 0.024 | 0.016 | 0.002 |
| Dislocation Density (Average Value, $cm^{-2}$) | 98 | 74 | 30 | 19 | 241 | 163 | 0 |
| Dislocation-Free Ratio (%) | 97.2 | 97.9 | 98.9 | 99.2 | 90.2 | 94.9 | 100 |
| Element Yield (%) | 85.5 | 86.8 | 90.6 | 89.8 | 70.7 | 78.0 | 73.5 |

<Review>

In each of the GaAs single crystal substrates of samples 11 to 14, samples 21 to 24, samples 31 to 34, and samples 41 to 44, the average value of the dislocation density of the main surface was 5 $cm^{-2}$ or more and 100 $cm^{-2}$ or less, and the dislocation-free ratio was 97.0% or more and 99.5% or less. Further, the atomic concentration of the silicon was $1.0 \times 10^{18}$ $cm^{-3}$ or more and $5.0 \times 10^{19}$ $cm^{-3}$ or less, and the carrier concentration was $1.0 \times 10^{18}$ $cm^{-3}$ or more and $4.0 \times 10^{18}$ $cm^{-3}$ or less. Further, the element yield in each of these GaAs single crystal substrates was 85% or more. On the other hand, in each of the GaAs single crystal substrates of samples 111 to 113, samples 121 to 123, samples 131 to 134, and samples 141 to 143, at least one of the average value of the dislocation density, the dislocation-free ratio, the atomic concentration of the silicon, and the carrier concentration of the surface did not fall within a corresponding one of the above ranges. In this case, the element yield in each of these GaAs single crystal substrates was less than 85%. It should be noted that the dislocation-free ratio of each of the GaAs single crystal substrates of sample 113, sample 123, sample 133, and sample 143 was 100%. However, each of the element yields of the GaAs single crystal substrates of sample 113, sample 123, sample 133, and sample 143 was deteriorated as compared with each of those of the GaAs single crystal substrates of samples 11 to 14, samples 21 to 24, samples 31 to 34, and samples 41 to 44 due to occurrence of cracking, chipping, or the like when obtaining the VCSEL-formed wafer.

Heretofore, the embodiments and examples of the present disclosure have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1 gallium arsenide single crystal substrate (GaAs single crystal substrate); 11 main surface; t dislocation; G imaginary grid; S slip line; 10 GaAs single crystal growth apparatus; 5 crucible; 51 seed crystal accommodation portion; 52 increased-diameter portion; 53 straight barrel portion; 6 crucible holding base; 7 heating element; 75 thermocouple; 8a seed crystal; 81 gallium arsenide single crystal (GaAs single crystal); 82 gallium arsenide melt (GaAs melt); D1 inner diameter of the straight barrel portion; D2 outer diameter of the crucible holding base; z direction from a lower side of the crucible to an upper side of the crucible along an axial direction of the crucible; r radial direction of the crucible; S10 preparation step; S20 step of obtaining the GaAs single crystal; S21 source material loading step; S22 source material melting step; S23 GaAs single crystal growth step; S30 step of obtaining the GaAs single crystal substrate.

The invention claimed is:

1. A gallium arsenide single crystal substrate comprising a main surface having a circular shape, wherein an average value of a dislocation density of the main surface is 5 $cm^{-2}$ or more and 100 $cm^{-2}$ or less, in an imaginary grid formed by laying out squares each having each side of 2 mm on the main surface such that a largest number of the squares are arranged side by side without overlapping with each other, a ratio of the number of squares in each of which no dislocation is present to a total number of the squares constituting the grid is 97.0% or more and 99.5% or less, and a diameter of the gallium arsenide single crystal substrate is 70 mm or more, the gallium arsenide single crystal substrate comprising silicon, wherein an atomic concentration of the silicon is $1.0 \times 10^{18}$ $cm^{-3}$ or more and $5.0 \times 10^{-19}$ $cm^{-3}$ or less, and a carrier concentration of the gallium arsenide single crystal substrate is $1.0 \times 10^{-18}$ $cm^{-3}$ or more and $4.0 \times 10^{-18}$ $cm^{-3}$ or less.

2. The gallium arsenide single crystal substrate according to claim 1, wherein a crystal plane of the main surface is a {100} plane of a gallium arsenide single crystal or a plane having an off angle of more than 0° and 3° or less with respect to the {100} plane of the gallium arsenide single crystal, the dislocation is included in a slip line, and the slip line is present along at least one direction selected from a group consisting of four directions equivalent to a [01-1] direction of the gallium arsenide single crystal, so as to extend from an outer periphery of the main surface toward an inner side of the main surface.

3. The gallium arsenide single crystal substrate according to claim 1, wherein the diameter of the gallium arsenide single crystal substrate is 70 mm or more and 210 mm or less.

4. The gallium arsenide single crystal substrate according to claim 2, wherein the diameter of the gallium arsenide single crystal substrate is 70 mm or more and 210 mm or less.

5. The gallium arsenide single crystal substrate according to claim 1, comprising boron, wherein an atomic concentration of the boron is $1.0 \times 10^{18}$ cm$^{-3}$ or more and $1.0 \times 10^{19}$ cm$^{-3}$ or less.

6. A method of producing a gallium arsenide single crystal substrate having a main surface having a circular shape, the method comprising:

obtaining a gallium arsenide single crystal by performing crystal growth using a gallium arsenide single crystal growth apparatus; and obtaining the gallium arsenide single crystal substrate by processing the gallium arsenide single crystal, wherein the gallium arsenide single crystal growth apparatus includes a crucible, a crucible holding base that holds the crucible, and a heating element that heats the crucible, the crucible includes a seed crystal accommodation portion having a cylindrical shape, an increased-diameter portion connected to the seed crystal accommodation portion, and a straight barrel portion connected to the increased-diameter portion, the seed crystal accommodation portion has a hollow portion, the hollow portion being opened on a side on which the seed crystal accommodation portion is connected to the increased-diameter portion, the hollow portion being provided with a bottom wall formed on a side opposite to the increased-diameter portion, the increased-diameter portion has a truncated conical shape having a diameter that is increased upward in an axial direction of the crucible, and is connected to the seed crystal accommodation portion on a small diameter side of the increased-diameter portion, the straight barrel portion has a hollow cylindrical shape and is connected to a large diameter side of the increased-diameter portion, the crucible holding base holds the increased-diameter portion without contact with the straight barrel portion, and when an inner diameter of the straight barrel portion is represented by D1 and an outer diameter of the crucible holding base is represented by D2, the D1 and the D2 satisfy a relation of $1.05 \leq D2/D1 < 1.5$, and a unit of each of the D1 and the D2 is mm.

7. The method of producing the gallium arsenide single crystal substrate according to claim 6, the obtaining the gallium arsenide single crystal includes accommodating the seed crystal into the seed crystal accommodation portion and accommodating gallium arsenide in a form of a lump together with silicon into each of the increased-diameter portion and the straight barrel portion, melting a part of the seed crystal and the gallium arsenide into a gallium arsenide melt by heating the crucible using the heating element and bringing the gallium arsenide melt into contact with a remainder of the seed crystal, and performing crystal growth of the gallium arsenide single crystal from the gallium arsenide melt on the remainder of the seed crystal, the performing the crystal growth is performed while performing control such that a value obtained by performing second-order differentiation onto a temperature at an interface between the gallium arsenide single crystal and the gallium arsenide melt becomes $0.003°$ C./mm$^2$ or more and $0.012°$ C./mm$^2$ or less, the second-order differentiation being performed at a position of the interface in an axial direction of the crucible, a positive direction of the position is a direction from a lower side of the crucible toward an upper side of the crucible along the axial direction, and a concentration of the silicon in the gallium arsenide single crystal substrate is $1.0 \times 10^{18}$ cm$^{-3}$ or more and $5.0 \times 10^{19}$ cm$^{-3}$ or less.

* * * * *